(12) United States Patent
Chen et al.

(10) Patent No.: US 12,438,037 B2
(45) Date of Patent: Oct. 7, 2025

(54) MANUFACTURING METHOD OF SEMICONDUCTOR STRUCTURE

(71) Applicant: Powerchip Semiconductor Manufacturing Corporation, Hsinchu (TW)

(72) Inventors: Kuo Hsiung Chen, Hsinchu County (TW); Ya-Ting Chen, Hsinchu County (TW); Chun-Ta Chen, Taichung (TW); Chang Tsung Lin, Taichung (TW); Shih-Ping Lee, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 429 days.

(21) Appl. No.: 18/162,635

(22) Filed: Jan. 31, 2023

(65) Prior Publication Data
US 2024/0222189 A1 Jul. 4, 2024

(30) Foreign Application Priority Data
Jan. 3, 2023 (TW) .................. 112100055

(51) Int. Cl.
*H01L 21/768* (2006.01)
*H01L 23/522* (2006.01)

(52) U.S. Cl.
CPC .. *H01L 21/76808* (2013.01); *H01L 21/76813* (2013.01); *H01L 21/76831* (2013.01);
(Continued)

(58) Field of Classification Search
CPC ......... H01L 21/76808; H01L 21/76813; H01L 21/76831; H01L 21/76832;
(Continued)

(56) References Cited

U.S. PATENT DOCUMENTS 6,455,417 B1 9/2002 Bao et al.
6,713,386 B1 3/2004 Hu et al.
(Continued)

OTHER PUBLICATIONS

"Office Action of Taiwan Counterpart Application", issued on Dec. 7, 2023, p. 1-p. 7.
(Continued)

*Primary Examiner* — Thanhha S Pham
(74) *Attorney, Agent, or Firm* — JCIPRNET

(57) ABSTRACT

A manufacturing method of a semiconductor structure including the following steps is provided. A substrate is provided. A first dielectric layer is formed on the substrate. A first conductive layer is formed in the first dielectric layer. A capping layer is formed on the first dielectric layer and the first conductive layer. The material of the capping layer is nitride. A diffusion barrier layer covering the capping layer is formed. The material of the diffusion barrier layer is silicon-rich oxide (SRO). A second dielectric layer is formed on the diffusion barrier layer. An opening is formed in the second dielectric layer. The opening exposes the diffusion barrier layer. A patterned photoresist layer is formed on the second dielectric layer. A patterning process is performed by using the patterned photoresist layer as a mask to expand the opening and to expose the first conductive layer.

10 Claims, 13 Drawing Sheets

(52) U.S. Cl.
CPC .. *H01L 21/76832* (2013.01); *H01L 21/76834* (2013.01); *H01L 23/5226* (2013.01)

(58) Field of Classification Search
CPC ......... H01L 21/76834; H01L 21/76829; H01L 21/76807; H01L 21/027–0274; H01L 23/5226
See application file for complete search history.

(56) References Cited

U.S. PATENT DOCUMENTS

| | | |
|---|---|---|
| 7,030,031 B2 | 4/2006 | Wille et al. |
| 7,052,932 B2 | 5/2006 | Huang et al. |
| 7,125,792 B2 | 10/2006 | Kumar et al. |
| 7,186,640 B2 | 3/2007 | Huang et al. |
| 10,468,244 B2 | 11/2019 | Li et al. |
| 2002/0111013 A1 | 8/2002 | Okada et al. |
| 2004/0110369 A1 | 6/2004 | Jiang et al. |
| 2004/0175932 A1 | 9/2004 | Kim et al. |
| 2005/0176236 A1 | 8/2005 | Lee et al. |
| 2009/0075474 A1 | 3/2009 | Lee et al. |
| 2017/0018458 A1* | 1/2017 | Cheng ............... H01L 21/76883 |

OTHER PUBLICATIONS

Hajime Nakao ; et al., "New chemical approach for resist poisoning problem in via first dual-damascene process," Proc. SPIE 6153, Mar. 2006, pp. 1-9.

* cited by examiner

MANUFACTURING METHOD OF SEMICONDUCTOR STRUCTURE

CROSS-REFERENCE TO RELATED APPLICATION

This application claims the priority benefit of Taiwan application serial no. 112100055, filed on Jan. 3, 2023. The entirety of the above-mentioned patent application is hereby incorporated by reference herein and made a part of this specification.

BACKGROUND

Technical Field

The invention relates to a manufacturing method of a semiconductor structure, and particularly relates to a manufacturing method of a semiconductor structure that can effectively prevent photoresist poisoning.

Description of Related Art

In the current interconnect process, the capping layer is formed on the conductive layer to prevent the material of the conductive layer from diffusing out. The material of the capping layer is usually nitride, which produces nitrogen-containing pollutants (e.g., amine). In the lithography process, the nitrogen-containing pollutants will diffuse into the photoresist and react chemically with the photoresist, thereby causing photoresist poisoning. As a result, a patterned photoresist layer with a desired pattern cannot be obtained. Therefore, how to prevent photoresist poisoning is the goal of continuous efforts.

SUMMARY

The invention provides a manufacturing method of a semiconductor structure, which can effectively prevent photoresist poisoning.

The invention provides a manufacturing method of a semiconductor structure, which includes the following steps. A substrate is provided. A first dielectric layer is formed on the substrate. A first conductive layer is formed in the first dielectric layer. A capping layer is formed on the first dielectric layer and the first conductive layer. The material of the capping layer is nitride. A diffusion barrier layer covering the capping layer is formed. The material of the diffusion barrier layer is silicon-rich oxide (SRO). A second dielectric layer is formed on the diffusion barrier layer. An opening is formed in the second dielectric layer. The opening exposes the diffusion barrier layer. A patterned photoresist layer is formed on the second dielectric layer. A patterning process is performed by using the patterned photoresist layer as a mask to expand the opening and to expose the first conductive layer.

According to an embodiment of the invention, in the manufacturing method of the semiconductor structure, the patterning process may include removing a portion of the second dielectric layer, a portion of the diffusion barrier layer, and a portion of the capping layer by using the patterned photoresist layer as a mask.

According to an embodiment of the invention, in the manufacturing method of the semiconductor structure, the expanded opening may include a first opening portion and a second opening portion. The first opening portion may be located in the diffusion barrier layer and in the capping layer and may expose the first conductive layer. The second opening portion is located above the first opening portion. The width of the second opening portion may be greater than or equal to the width of the first opening portion.

According to an embodiment of the invention, the manufacturing method of the semiconductor structure may further include the following step. A planarization layer is formed on the top surface of the second dielectric layer and in the opening. The patterned photoresist layer may be formed on the planarization layer.

According to an embodiment of the invention, in the manufacturing method of the semiconductor structure, the method of forming the planarization layer may be a spin coating method.

According to an embodiment of the invention, in the manufacturing method of the semiconductor structure, the planarization layer may include a filling layer and a planarization material layer. The method of forming the planarization layer may include the following steps. A filling material layer is formed on the top surface of the second dielectric layer and in the opening. An etch-back process is performed on the filling material layer to form the filling layer. The planarization material layer is formed on the top surface of the second dielectric layer and in the opening. The planarization material layer may be connected to the filling layer.

According to an embodiment of the invention, the manufacturing method of the semiconductor structure may further include the following step. A portion of the planarization layer is removed by using the patterned photoresist layer as a mask.

According to an embodiment of the invention, the manufacturing method of the semiconductor structure may further include the following step. The patterned photoresist layer is removed after the first conductive layer is exposed.

According to an embodiment of the invention, the manufacturing method of the semiconductor structure may further include the following step. A second conductive layer is formed in the expanded opening. The second conductive layer may be electrically connected to the first conductive layer.

According to an embodiment of the invention, in the manufacturing method of the semiconductor structure, the second conductive layer may be a dual damascene structure.

The invention provides another manufacturing method of a semiconductor structure, which includes the following steps. A substrate is provided. A first dielectric layer is formed on the substrate. A first conductive layer is formed in the first dielectric layer. A capping layer is formed on the first dielectric layer and the first conductive layer. The material of the capping layer is nitride. A second dielectric layer is formed on the capping layer. An opening is formed in second dielectric layer. The opening exposes the capping layer. A diffusion barrier layer is formed in the opening. The diffusion barrier layer covers the capping layer exposed by the opening. A patterned photoresist layer is formed on the second dielectric layer. A patterning process is performed by using the patterned photoresist layer as a mask to expand the opening and to expose the first conductive layer.

According to another embodiment of the invention, in the manufacturing method of the semiconductor structure, the patterning process may include removing a portion of the diffusion barrier layer, a portion of the second dielectric layer, and a portion of the capping layer by using the patterned photoresist layer as a mask.

According to another embodiment of the invention, in the manufacturing method of the semiconductor structure, after the portion of the diffusion barrier layer is removed, the remaining diffusion barrier layer may form a diffusion barrier spacer on the sidewall of the expanded opening.

According to another embodiment of the invention, in the manufacturing method of the semiconductor structure, the expanded opening may include a first opening portion and a second opening portion. The first opening portion may be located in the capping layer and may expose the first conductive layer. The second opening portion is located above the first opening portion. The width of the second opening portion may be greater than or equal to the width of the first opening portion.

According to another embodiment of the invention, the manufacturing method of the semiconductor structure may further include the following step. A planarization layer is formed above the top surface of the second dielectric layer, on the diffusion barrier layer, and in the opening. The patterned photoresist layer may be formed on the planarization layer.

According to another embodiment of the invention, in the manufacturing method of the semiconductor structure, the method of forming the planarization layer may be a spin coating method.

According to another embodiment of the invention, in the manufacturing method of the semiconductor structure, the planarization layer may include a filling layer and a planarization material layer. The method of forming the planarization layer may include the following steps. A filling material layer is formed above the top surface of the second dielectric layer, on the diffusion barrier layer, and in the opening. An etch-back process is performed on the filling material layer to form the filling layer. The planarization material layer is formed above the top surface of the second dielectric layer and in the opening. The planarization material layer may be connected to the filling layer.

According to another embodiment of the invention, the manufacturing method of the semiconductor structure may further include the following step. A portion of the planarization layer is removed by using the patterned photoresist layer as a mask.

According to another embodiment of the invention, the manufacturing method of the semiconductor structure may further include the following step. The patterned photoresist layer is removed after the first conductive layer is exposed.

According to another embodiment of the invention, the manufacturing method of the semiconductor structure may further include the following step. A second conductive layer is formed in the expanded opening. The second conductive layer may be electrically connected to the first conductive layer.

Based on the above description, in the manufacturing method of the semiconductor structure according to the invention, since the diffusion barrier layer covers the capping layer, the diffusion of the nitrogen-containing pollutants produced by the capping layer can be blocked by the diffusion barrier layer. Therefore, in the lithography process for forming the patterned photoresist layer, photoresist poisoning can be effectively prevented. In this way, the patterned photoresist layer with a desired pattern can be obtained.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. In fact, the dimensions of the various features may be arbitrarily increased or reduced for clarity of discussion.

FIG. 1A to FIG. 1F are cross-sectional views illustrating a manufacturing process of a semiconductor structure according to some embodiments of the invention.

Figure 1A:
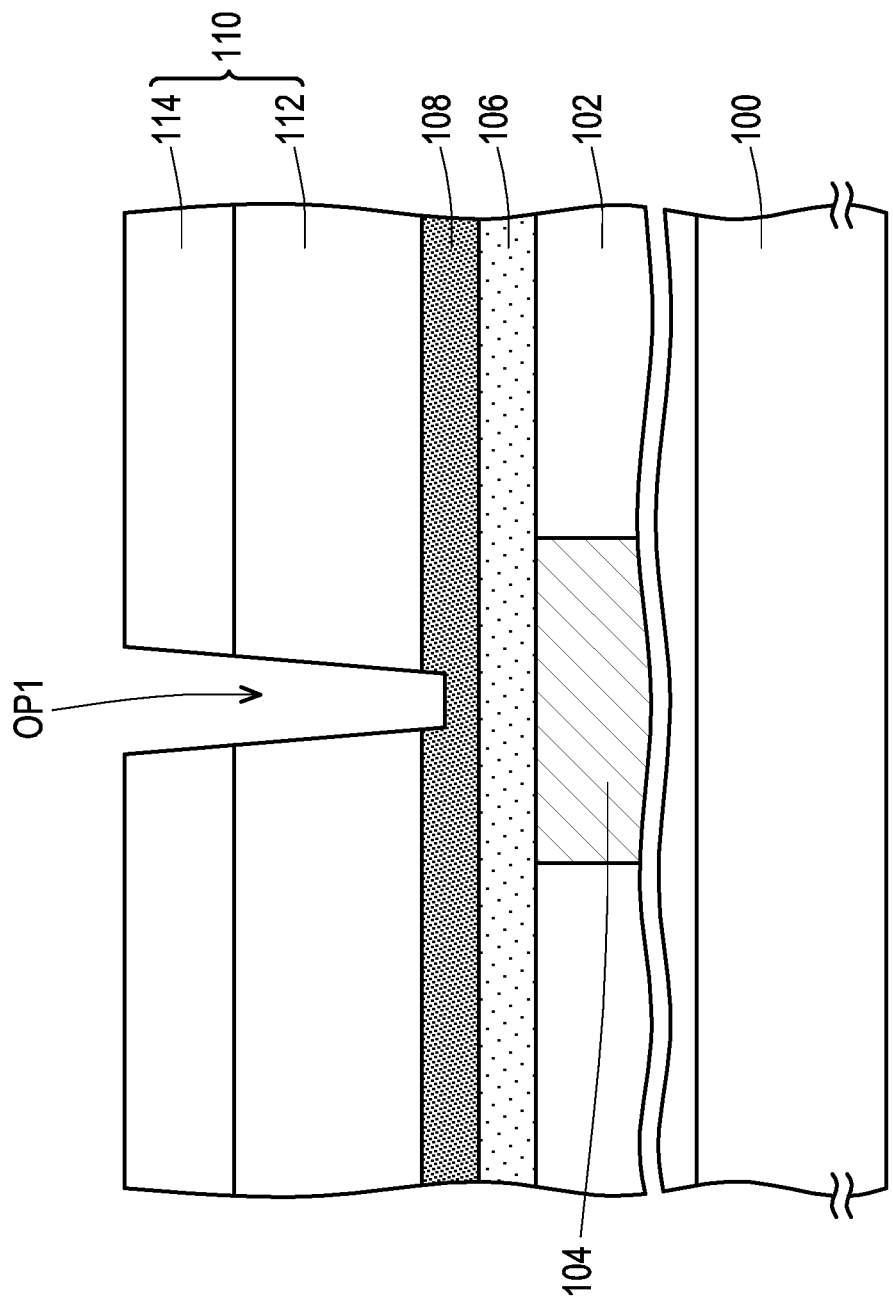
FIG. 1A to FIG. 1F are cross-sectional views illustrating a manufacturing process of a semiconductor structure according to some embodiments of the invention.

Referring to FIG. 1A, a substrate 100 is provided. In some embodiments, the substrate 100 may be a semiconductor substrate such as a silicon substrate. In addition, although not shown in the figure, the substrate 100 may have required components (e.g., transistor devices, dielectric layers, and/or interconnect structures) therein or thereon, and the description thereof is omitted here.

A dielectric layer 102 is formed on the substrate 100. In some embodiments, the material of the dielectric layer 102 is, for example, silicon oxide or a low dielectric constant (low-k) material. In some embodiments, the method of forming the dielectric layer 102 is, for example, a chemical vapor deposition (CVD) method.

In addition, a conductive layer 104 is formed in the dielectric layer 102. In some embodiments, the material of the conductive layer 104 is, for example, metal such as copper. In some embodiments, the conductive layer 104 may be formed by a damascene process, but the invention is not limited thereto. Furthermore, a barrier layer (not shown) may be formed between the conductive layer 104 and the dielectric layer 102, and the description thereof is omitted here.

A capping layer 106 is formed on the dielectric layer 102 and the conductive layer 104. The material of the capping layer 106 is nitride. In some embodiments, the material of the capping layer 106 is, for example, silicon carbonitride (SiCN) or silicon nitride (SiN). In some embodiments, the method of forming the capping layer 106 is, for example, a CVD method.

A diffusion barrier layer 108 covering the capping layer 106 is formed. The diffusion barrier layer 108 can block the diffusion of the nitrogen-containing pollutants produced by the capping layer 106. The material of the diffusion barrier layer 108 is silicon-rich oxide (SRO). In the text, "silicon-rich oxide" may be a silicon oxide material having a silicon content greater than the silicon content of silicon dioxide. In some embodiments, the method of forming the diffusion barrier layer 108 is, for example, a CVD method.

Furthermore, a dielectric layer 110 is formed on the diffusion barrier layer 108. The dielectric layer 110 may be a single-layer structure or a multilayer structure. In the present embodiment, the dielectric layer 110 is, for example, a multilayer structure. For example, the dielectric layer 110 may include a dielectric layer 112 and a dielectric layer 114, but the invention is not limited thereto. The dielectric layer 112 is located on the diffusion barrier layer 108. In some embodiments, the dielectric layer 112 is made of a low dielectric constant (low-k) material such as silicon oxycarbide (SiCO), for example. In some embodiments, the method of forming the dielectric layer 112 is, for example, a CVD method. The dielectric layer 114 is located on the dielectric layer 112. In some embodiments, the material of the dielectric layer 114 is, for example, silicon oxide, such as tetraethyl orthosilicate (TEOS) silicon oxide. In some embodiments, the method of forming the dielectric layer 114 is, for example, a CVD method.

An opening OP1 is formed in the dielectric layer 110. The opening OP1 exposes the diffusion barrier layer 108. In some embodiments, the opening OP1 may be formed by patterning the dielectric layer 110 through a lithography process and an etching process (e.g., dry etching process). In addition, in the etching process (e.g., dry etching process) used for forming the opening OP1, since the etching rate of the diffusion barrier layer 108 is lower than the etching rate of the dielectric layer 110, the diffusion barrier layer 108 may be used as an etching stop layer, thereby improving the process window of the etching process.

Figure 1B:
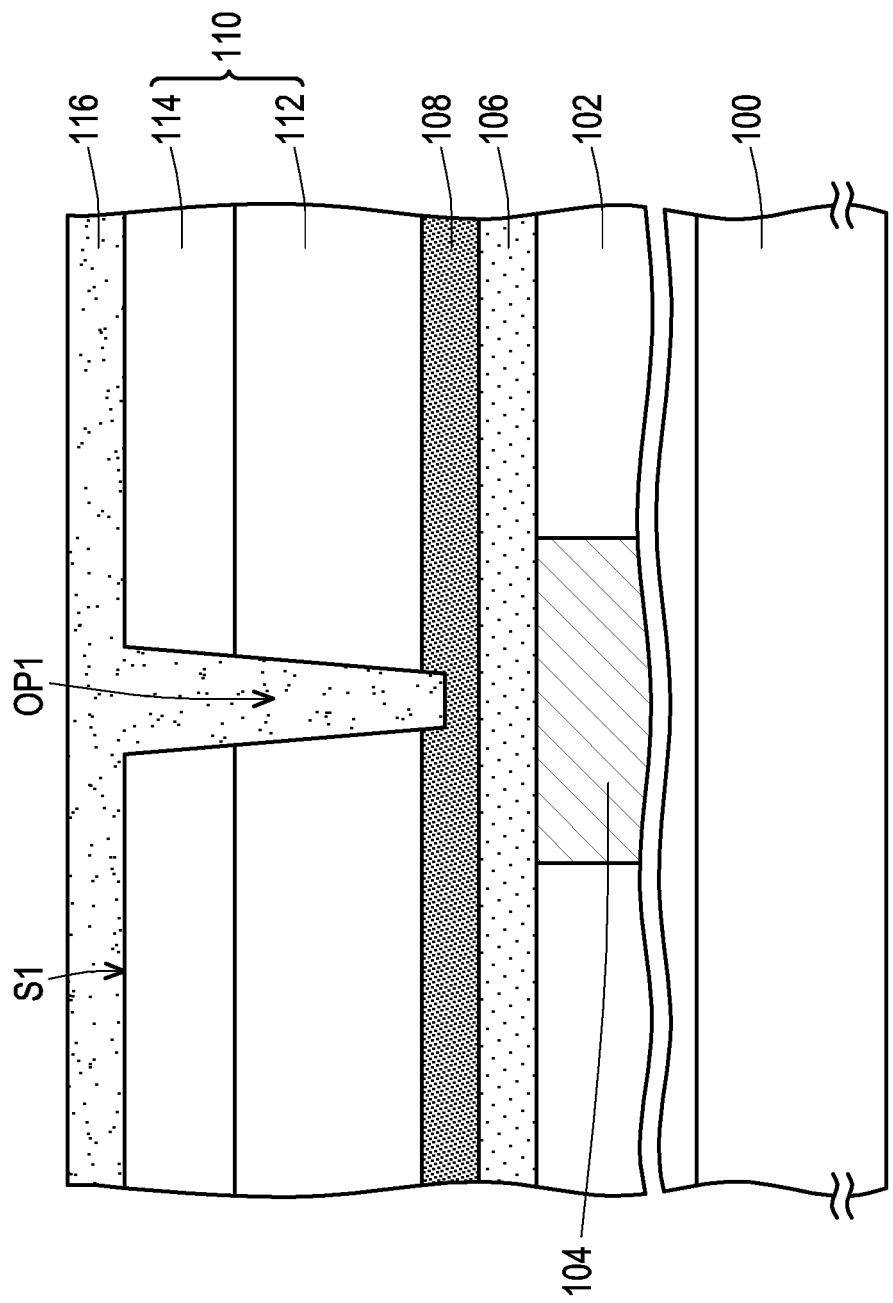

Referring to FIG. 1B, a filling material layer 116 may be formed on the top surface S1 of the dielectric layer 110 and in the opening OP1. In some embodiments, the material of the filling material layer 116 is, for example, an organic material, that is, the filling material layer 116 may be an organic planarization layer (OPL). In some embodiments, the method of forming the filling material layer 116 is, for example, a spin coating method.

Figure 1C:
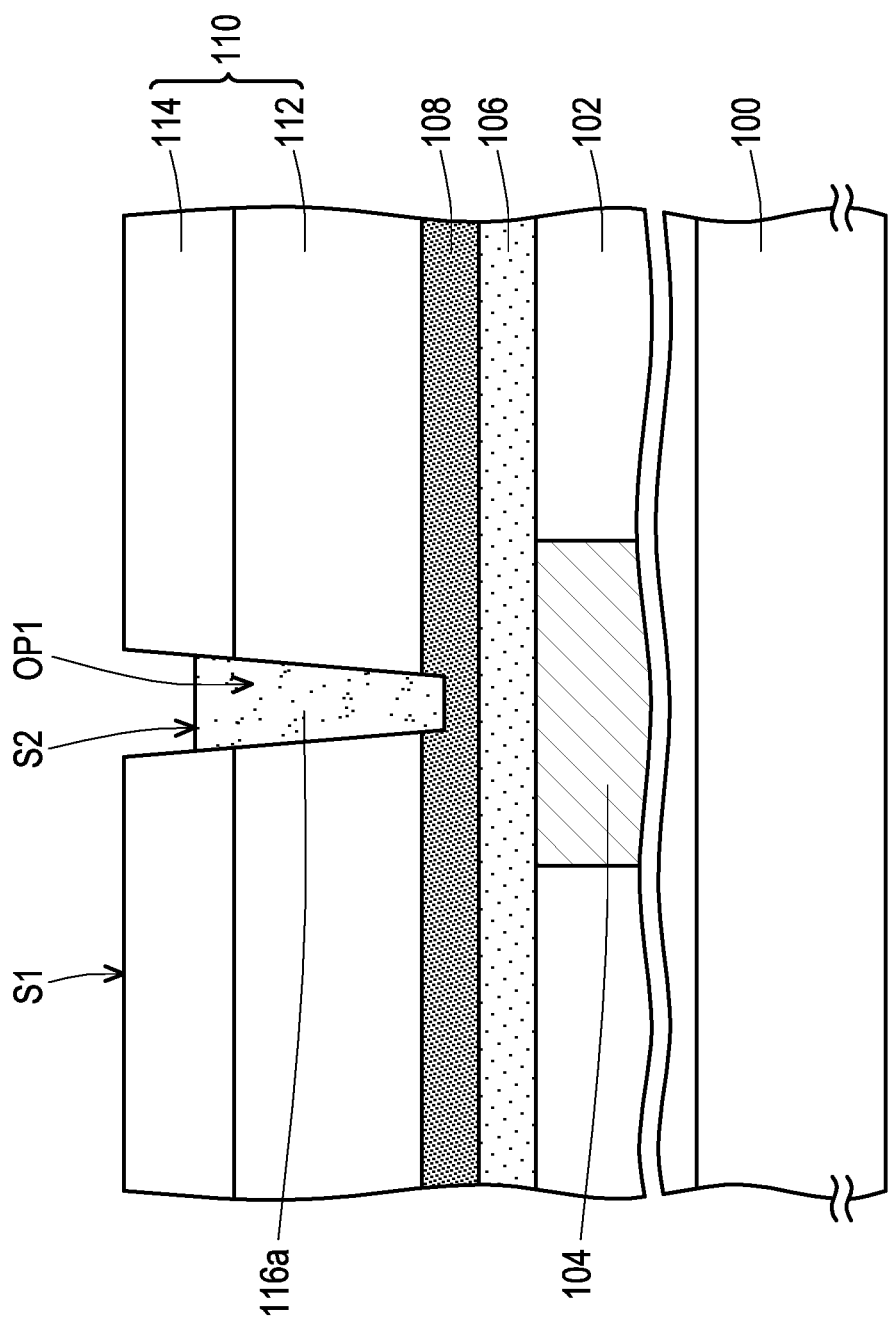

Referring to FIG. 1C, an etch-back process may be performed on the filling material layer 116 to form a filling layer 116a. In some embodiments, the top surface S2 of the filling layer 116a may be lower than the top surface S1 of the dielectric layer 110. In some embodiments, the etch-back process is, for example, a dry etch process.

Figure 1D:
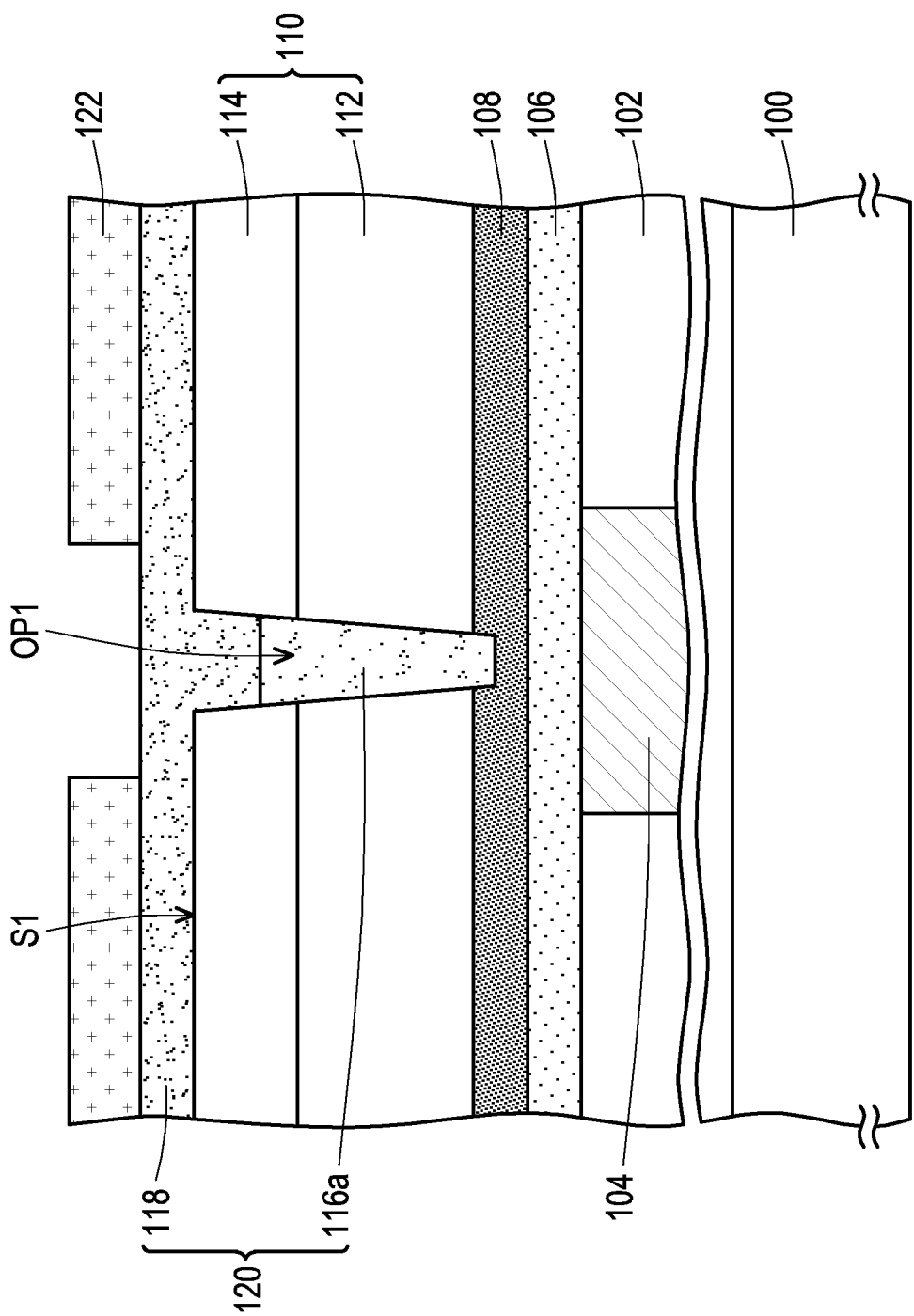

Referring to FIG. 1D, a planarization material layer 118 may be formed on the top surface S1 of the dielectric layer 110 and in the opening OP1. The planarization material layer 118 may be connected to the filling layer 116a. In some embodiments, the material of the planarization material layer 118 is, for example, an organic material, that is, the planarization material layer 118 may be an organic planarization layer. In some embodiments, the method of forming the planarization material layer 118 is, for example, a spin coating method.

By the above method, a planarization layer 120 may be formed on the top surface S1 of the dielectric layer 110 and in the opening OP1. The planarization layer 120 may include the filling layer 116a and the planarization material layer 118. The filling layer 116a is located in the opening OP1. The planarization material layer 118 is located on the top surface S1 of the dielectric layer 110 and the filling layer 116a and fills the opening OP1.

In the present embodiment, the planarization layer 120 may be formed by the above method, but the invention is not limited thereto. In other embodiments, the method of forming the planarization layer 120 may be a spin coating method, that is, the planarization layer 120 may be directly formed on the top surface S1 of the dielectric layer 110 and in the opening OP1 by a single spin coating process.

A patterned photoresist layer 122 is formed on the dielectric layer 110. In some embodiments, the patterned photoresist layer 122 may be formed on planarization layer 120. In some embodiments, the patterned photoresist layer 122 may be formed by a lithography process. In addition, since the diffusion barrier layer 108 covers the capping layer 106, the diffusion of the nitrogen-containing pollutants produced by the capping layer 106 can be blocked by the diffusion barrier layer 108. Therefore, in the lithography process for forming the patterned photoresist layer 122, photoresist poisoning can be effectively prevented. In this way, the patterned photoresist layer 122 with a desired pattern can be obtained.

Figure 1E:
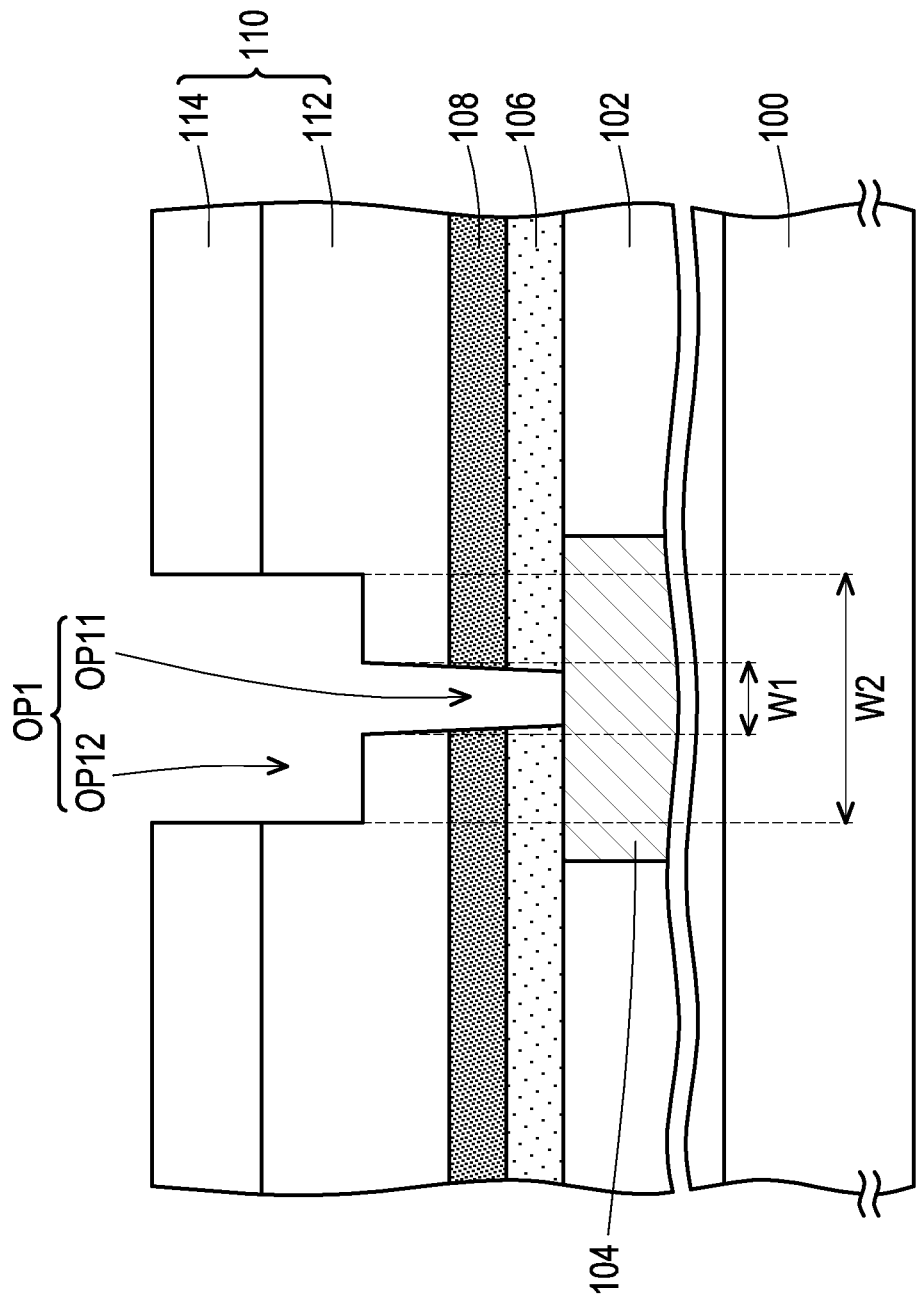

Referring to FIG. 1E, a patterning process is performed by using the patterned photoresist layer 122 as a mask to expand the opening OP1 and to expose the conductive layer 104. The expanded opening OP1 may include an opening portion OP11 and an opening portion OP12. The opening portion OP11 may be located in the diffusion barrier layer 108 and the capping layer 106 and may expose the conductive layer 104. In some embodiments, the opening portion OP11 may be an opening for accommodating a via. The opening portion OP12 is located above the opening portion OP11. In some embodiments, the opening portion OP12 may be an opening for accommodating a conductive line. The width W2 of the opening portion OP12 may be greater than or equal to the width W1 of the opening portion OP11.

In some embodiments, the patterning process may include removing a portion of the planarization layer 120, a portion of the dielectric layer 110, a portion of the diffusion barrier layer 108, and a portion of the capping layer 106 by using the patterned photoresist layer 122 as a mask. In some embodiments, the method of removing the portion of the planarization layer 120, the portion of the dielectric layer 110, the portion of the diffusion barrier layer 108, and the portion of the capping layer 106 is, for example, a dry etching method. In some embodiments, in the dry etching process for removing the portion of the planarization layer 120, the portion of the dielectric layer 110, the portion of the diffusion barrier layer 108, and the portion of the capping layer 106, the planarization layer 120 may have a higher etching rate.

The patterned photoresist layer 122 may be removed after the conductive layer 104 is exposed. In some embodiments, the method of removing the patterned photoresist layer 122 is, for example, a dry stripping method or a wet stripping method. In addition, in the process of removing the patterned photoresist layer 122, the planarization layer 120 located directly below the patterned photoresist layer 122 may be simultaneously removed.

Figure 1F:
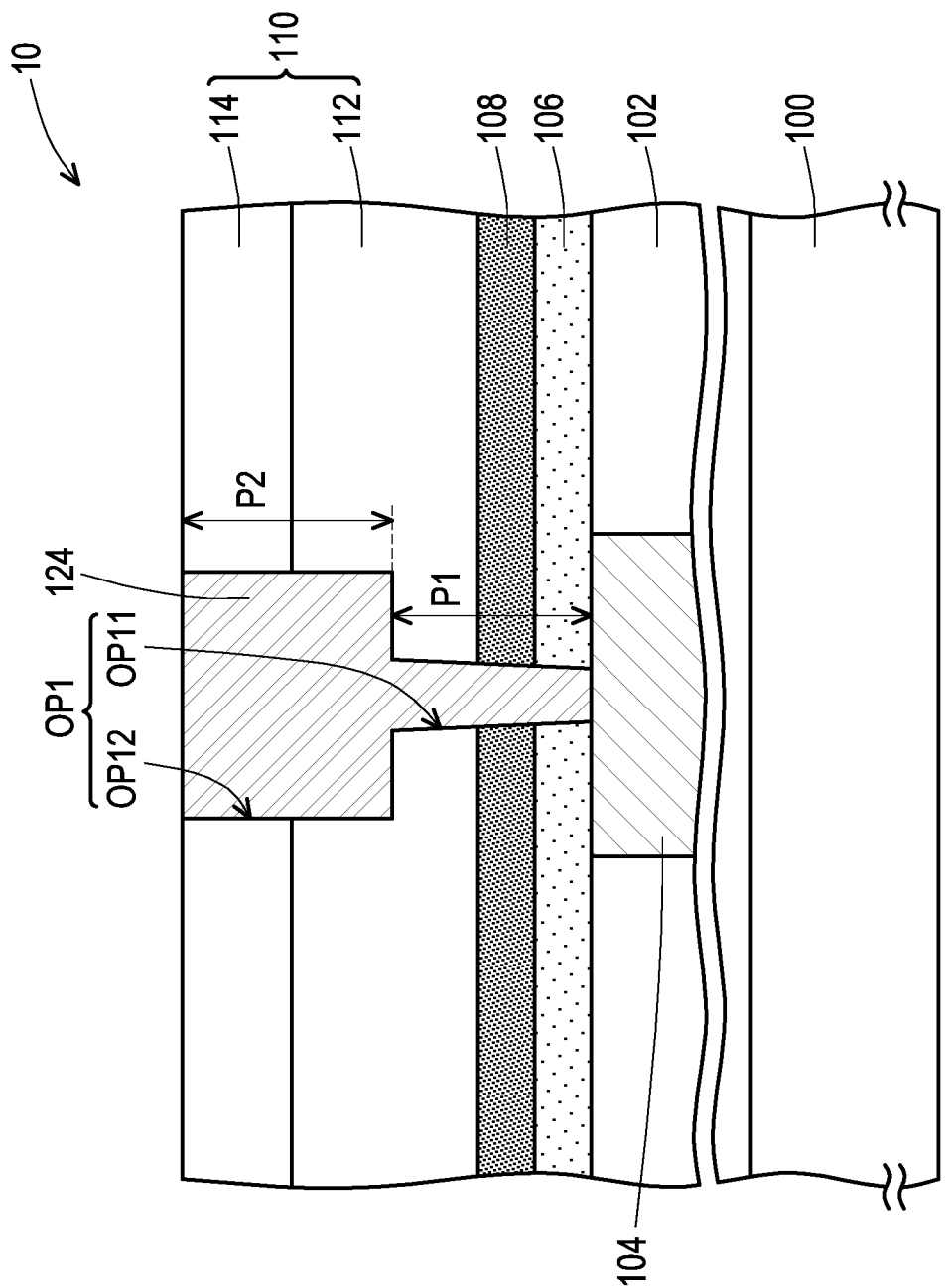

Referring to FIG. 1F, a conductive layer 124 may be formed in the expanded opening OP1. The conductive layer 124 may be electrically connected to the conductive layer 104. In some embodiments, the conductive layer 124 may be a dual damascene structure. In some embodiments, the conductive layer 124 may include a via portion P1 and a conductive line portion P2. The via portion P1 is located in the opening portion OP11. The conductive line portion P2 is located in the opening portion OP12. The conductive line portion P2 may be connected to the via portion P1. In some embodiments, the via portion P1 and the conductive line portion P2 may be integrally formed. In some embodiments, the material of the conductive layer 124 is, for example, metal such as copper. In some embodiments, the conductive layer 124 may be formed by a dual damascene process. In addition, a barrier layer (not shown) may be formed between the conductive layer 124 and the dielectric layer 110, between the conductive layer 124 and the diffusion barrier layer 108, between the conductive layer 124 and the capping layer 106, and between the conductive layer 124 and the conductive layer 104, and the description thereof is omitted here.

Based on the above embodiments, in the manufacturing method of the semiconductor structure 10, since the diffusion barrier layer 108 covers the capping layer 106, the diffusion of the nitrogen-containing pollutants produced by the capping layer 106 can be blocked by the diffusion barrier layer 108. Therefore, in the lithography process for forming the patterned photoresist layer 122, photoresist poisoning can be effectively prevented. In this way, the patterned photoresist layer 122 with a desired pattern can be obtained.

FIG. 2A to FIG. 2G are cross-sectional views illustrating a manufacturing process of a semiconductor structure according to other embodiments of the invention.

Figure 2A:
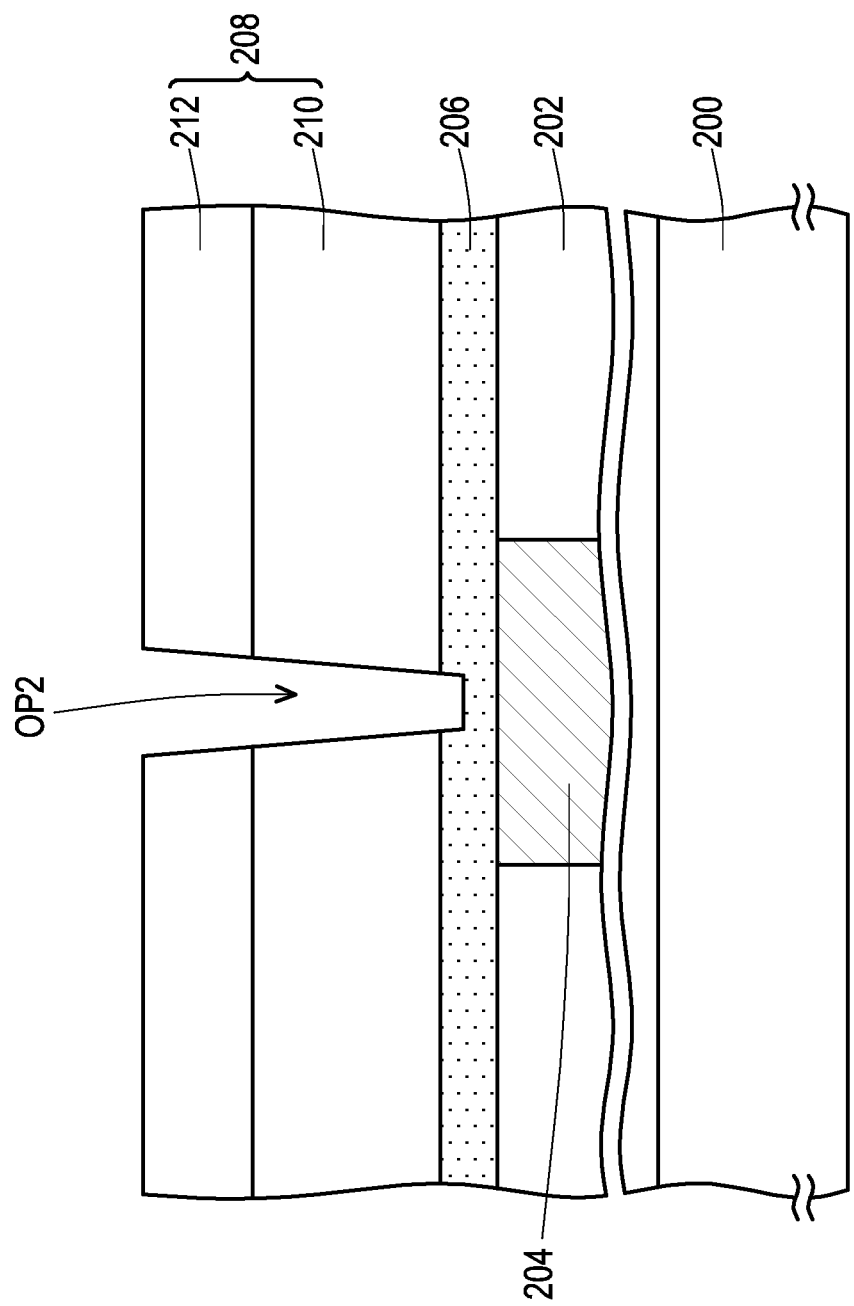
FIG. 2A to FIG. 2G are cross-sectional views illustrating a manufacturing process of a semiconductor structure according to other embodiments of the invention.

Referring to FIG. 2A, a substrate 200 is provided. In some embodiments, the substrate 200 may be a semiconductor substrate such as a silicon substrate. In addition, although not shown in the figure, the substrate 200 may have required components (e.g., transistor devices, dielectric layers, and/or interconnect structures) therein or thereon, and the description thereof is omitted here.

A dielectric layer 202 is formed on the substrate 200. In some embodiments, the material of the dielectric layer 202 is, for example, silicon oxide or a low dielectric constant (low-k) material. In some embodiments, the method of forming the dielectric layer 202 is, for example, a CVD method.

In addition, a conductive layer 204 is formed in the dielectric layer 202. In some embodiments, the material of the conductive layer 204 is, for example, metal such as copper. In some embodiments, the conductive layer 204 may be formed by a damascene process, but the invention is not limited thereto. Furthermore, a barrier layer (not shown) may be formed between the conductive layer 204 and the dielectric layer 202, and the description thereof is omitted here.

A capping layer 206 is formed on the dielectric layer 202 and the conductive layer 204. The material of the capping layer 206 is nitride. In some embodiments, the material of the capping layer 206 is, for example, silicon carbonitride or silicon nitride. In some embodiments, the method of forming the capping layer 106 is, for example, a CVD method.

A dielectric layer 208 is formed on the capping layer 206. The dielectric layer 208 may be a single-layer structure or a multilayer structure. In the present embodiment, the dielectric layer 208 is, for example, a multilayer structure. For example, the dielectric layer 208 may include a dielectric layer 210 and a dielectric layer 212, but the invention is not limited thereto. The dielectric layer 210 is located on the capping layer 206. In some embodiments, the dielectric layer 210 is made of a low dielectric constant (low-k) material such as silicon oxycarbide (SiCO), for example. In some embodiments, the method of forming the dielectric layer 210 is, for example, a CVD method. The dielectric layer 212 is located on the dielectric layer 210. In some embodiments, the material of the dielectric layer 212 is, for example, silicon oxide, such as tetraethyl orthosilicate (TEOS) silicon oxide. In some embodiments, the method of forming the dielectric layer 212 is, for example, a CVD method.

An opening OP2 is formed in the dielectric layer 208. The opening OP2 exposes the capping layer 206. In some embodiments, the opening OP2 may be formed by patterning the dielectric layer 208 through a lithography process and an etching process (e.g., dry etching process). In addition, in the etching process (e.g., dry etching process) used for forming the opening OP2, since the etching rate of the capping layer 206 is lower than the etching rate of the dielectric layer 208, the capping layer 206 may be used as an etching stop layer, thereby improving the process window of the etching process.

Figure 2B:
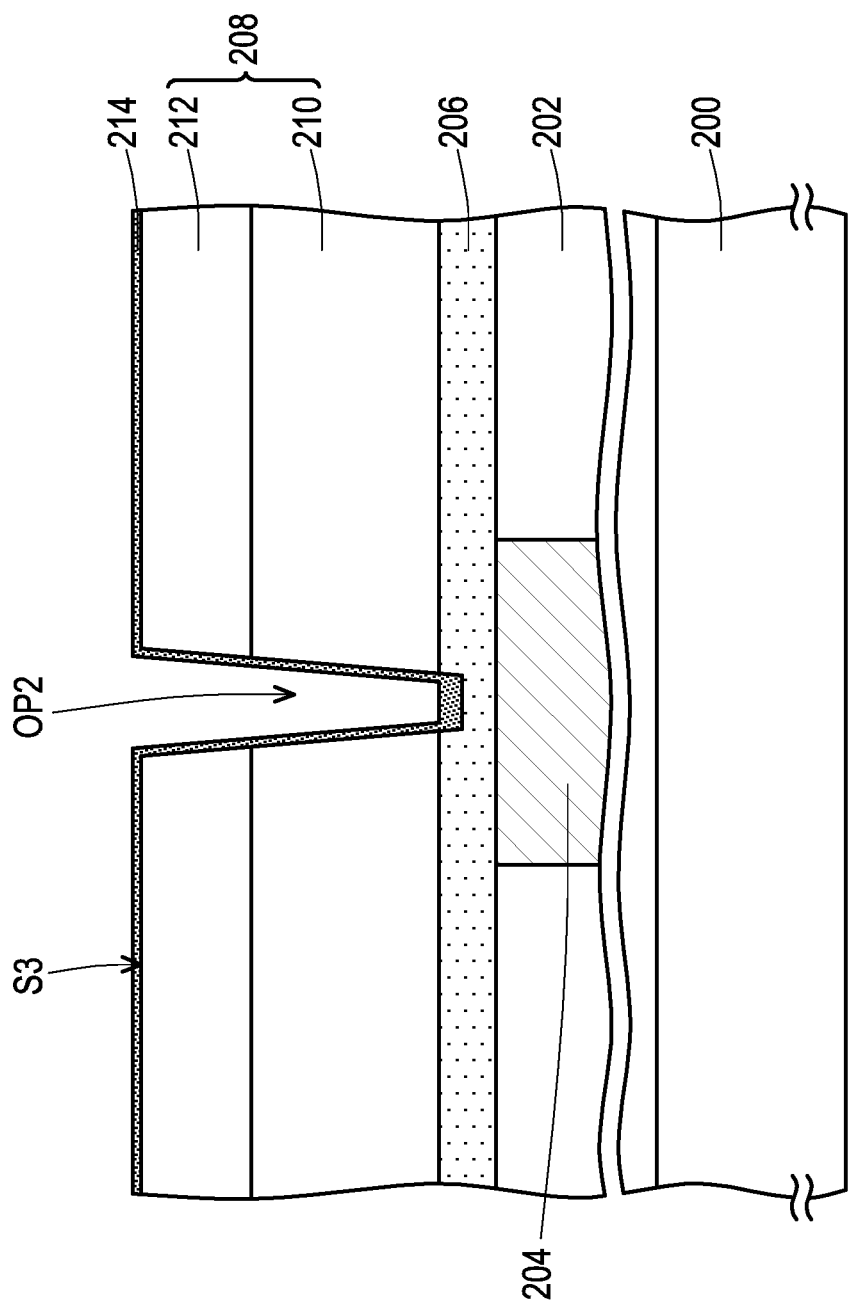

Referring to FIG. 2B, a diffusion barrier layer 214 is formed in the opening OP2. The diffusion barrier layer 214 may be further formed on the top surface S3 of the dielectric layer 208. In some embodiments, the diffusion barrier layer 214 may be conformally formed on the dielectric layer 208 and in the opening OP2. The diffusion barrier layer 214 covers the capping layer 206 exposed by the opening OP2. The diffusion barrier layer 214 can block the diffusion of the nitrogen-containing pollutants produced by the capping layer 206. In some embodiments, the material of the diffusion barrier layer 214 is, for example, silicon oxide, silicon-rich oxide (SRO), or a low dielectric constant (low-k) material. In some embodiments, the method of forming the diffusion barrier layer 214 is, for example, a CVD method, a physical vapor deposition (PVD) method, or an atomic layer deposition (ALD) method.

Figure 2C:
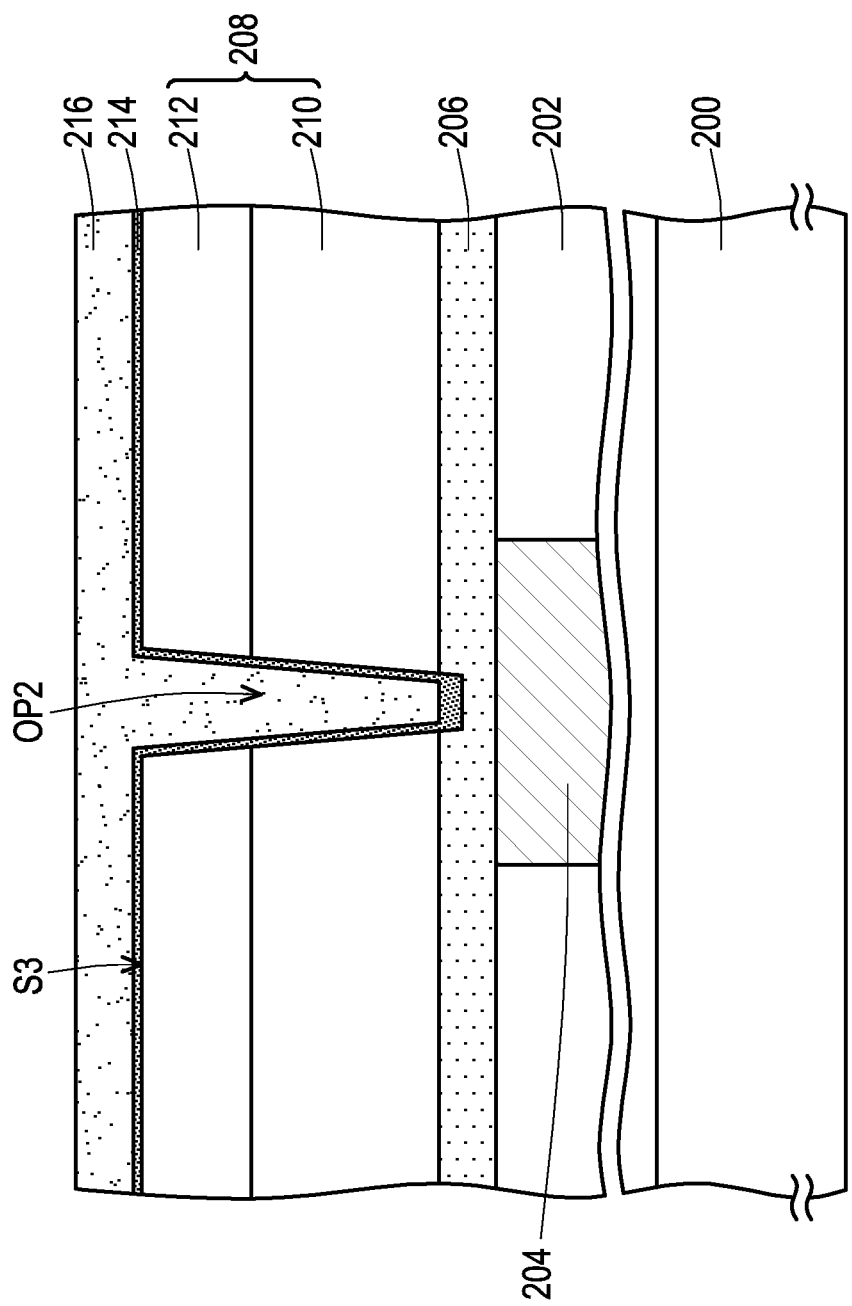

Referring to FIG. 2C, a filling material layer 216 may be formed above the top surface S3 of the dielectric layer 208, on the diffusion barrier layer 214, and in the opening OP2. In some embodiments, the material of the filling material layer 216 is, for example, an organic material, that is, the filling material layer 216 may be an organic planarization layer. In some embodiments, the method of forming the filling material layer 216 is, for example, a spin coating method.

Figure 2D:
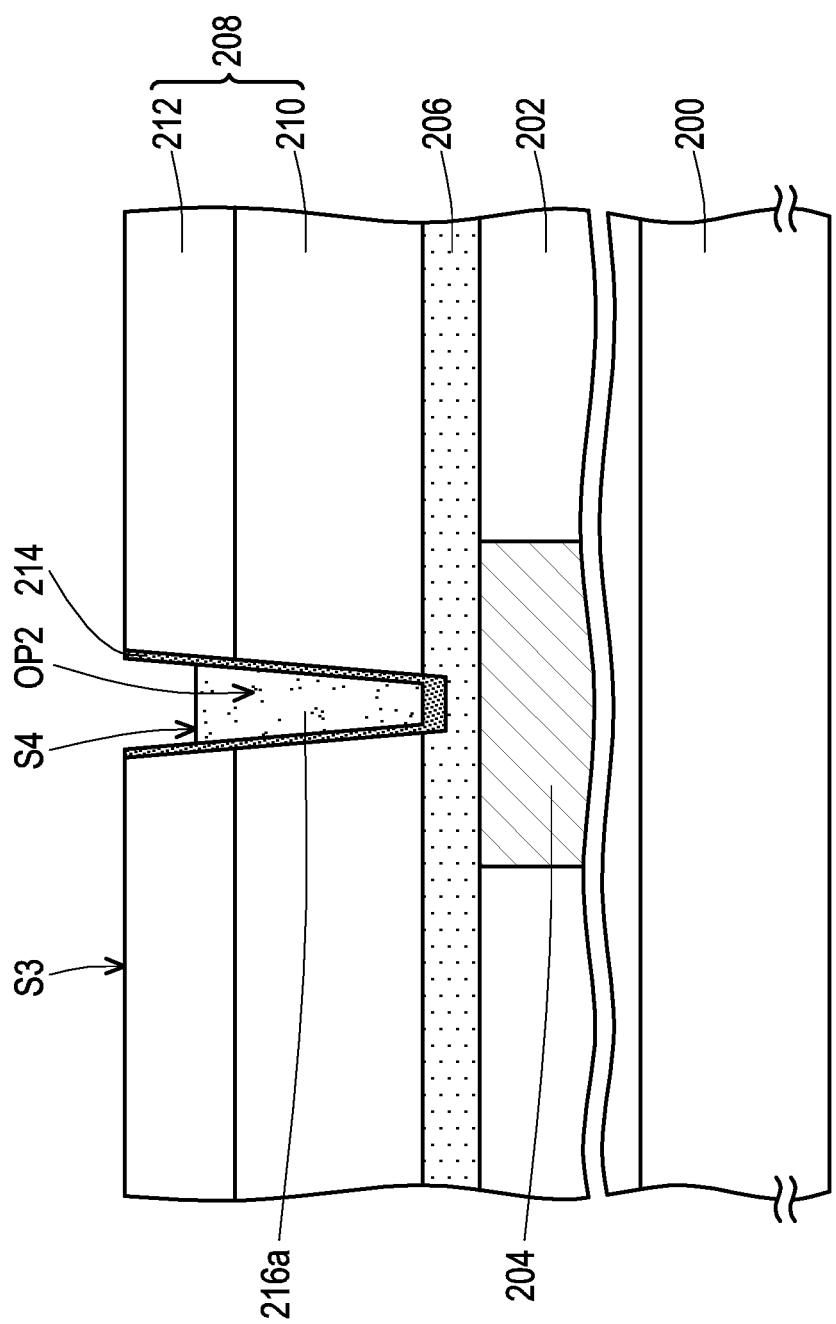

Referring to FIG. 2D, an etch-back process may be performed on the filling material layer 216 to form a filling layer 216a. In some embodiments, the top surface S4 of the filling layer 216a may be lower than the top surface S3 of the dielectric layer 208. In some embodiments, in the etch-back process, a portion of the diffusion barrier layer 214 located on the top surface S3 of the dielectric layer 208 may be simultaneously removed. In other embodiments, a portion of the diffusion barrier layer 214 located on the top surface S3 of the dielectric layer 208 may not be removed by the etch-back process, and the remaining portion of the diffusion barrier layer 214 can improve the protection of the subsequently formed photoresist layer, thereby preventing photoresist poisoning. In some embodiments, the etch-back process is, for example, a dry etch process.

Figure 2E:
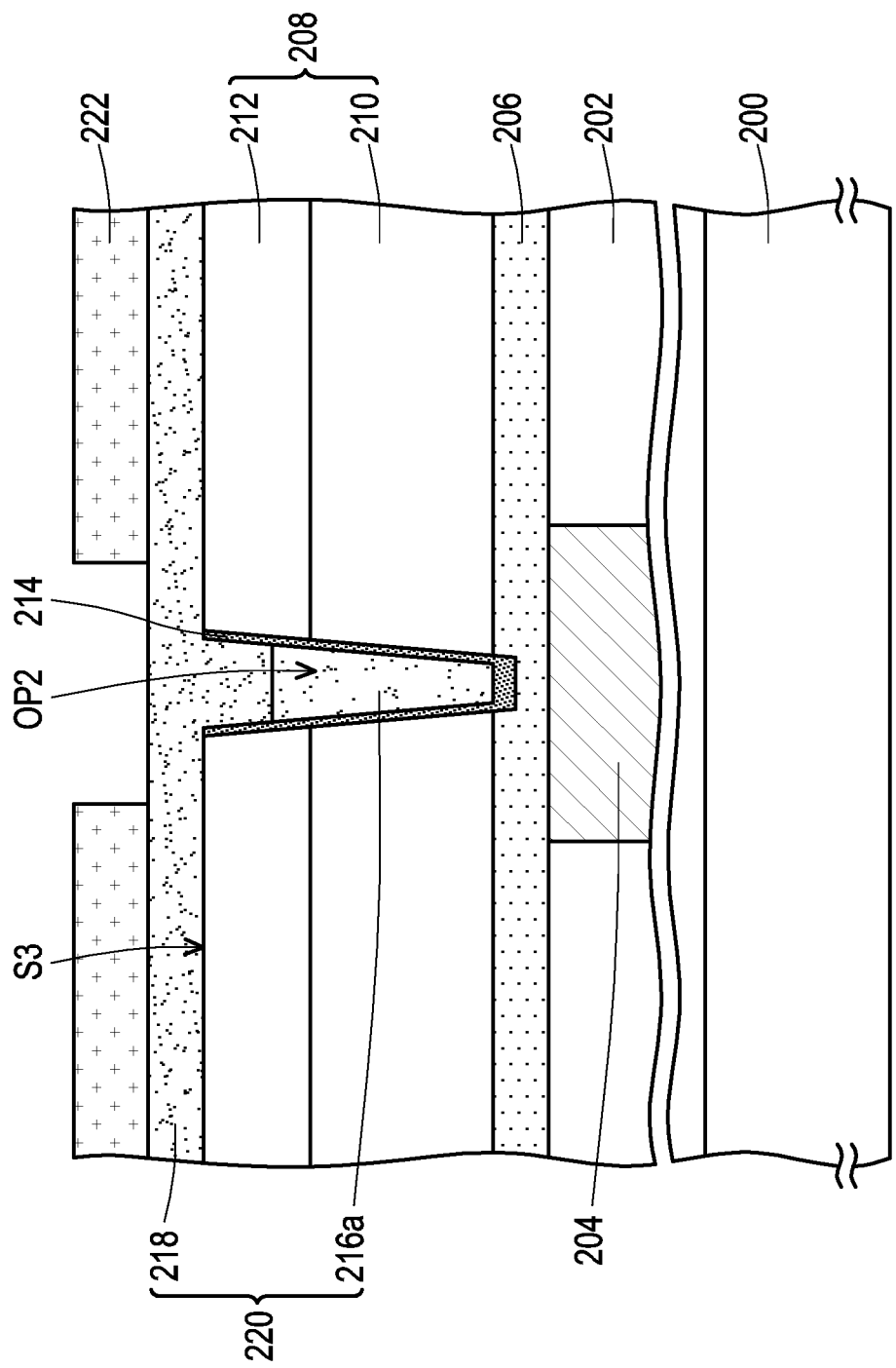

Referring to FIG. 2E, a planarization material layer 218 may be formed above the top surface S3 of the dielectric layer 208 and in the opening OP2. The planarization material layer 218 may be connected to the filling layer 216a. In some embodiments, the material of the planarization material layer 218 is, for example, an organic material, that is, the planarization material layer 218 may be an organic planarization layer. In some embodiments, the method forming of the planarization material layer 218 is, for example, a spin coating method.

By the above method, a planarization layer 220 may be formed above the top surface S3 of the dielectric layer 208, on the diffusion barrier layer 214, and in the opening OP2. The planarization layer 220 may include the filling layer 216a and the planarization material layer 218. The filling layer 216a is located in the opening OP2. The planarization material layer 218 is located above the top surface S3 of the dielectric layer 208 and on the filling layer 216a and fills the opening OP2.

In the present embodiment, the planarization layer 220 may be formed by the above method, but the invention is not limited thereto. In other embodiments, the method of forming the planarization layer 220 may be a spin coating method, that is, the planarization layer 220 may be directly formed above the top surface S3 of the dielectric layer 208, on the diffusion barrier layer 214, and in the opening OP2 by a single spin coating process.

A patterned photoresist layer 222 is formed on the dielectric layer 208. In some embodiments, the patterned photoresist layer 222 may be formed on the planarization layer 220. In some embodiments, the patterned photoresist layer 222 may be formed by a lithography process. In addition, since the diffusion barrier layer 214 covers the capping layer 206, the diffusion of the nitrogen-containing pollutants produced by the capping layer 206 can be blocked by the diffusion barrier layer 214. Therefore, in the lithography process for forming the patterned photoresist layer 222, photoresist poisoning can be effectively prevented. In this way, the patterned photoresist layer 222 with a desired pattern can be obtained.

Figure 2F:
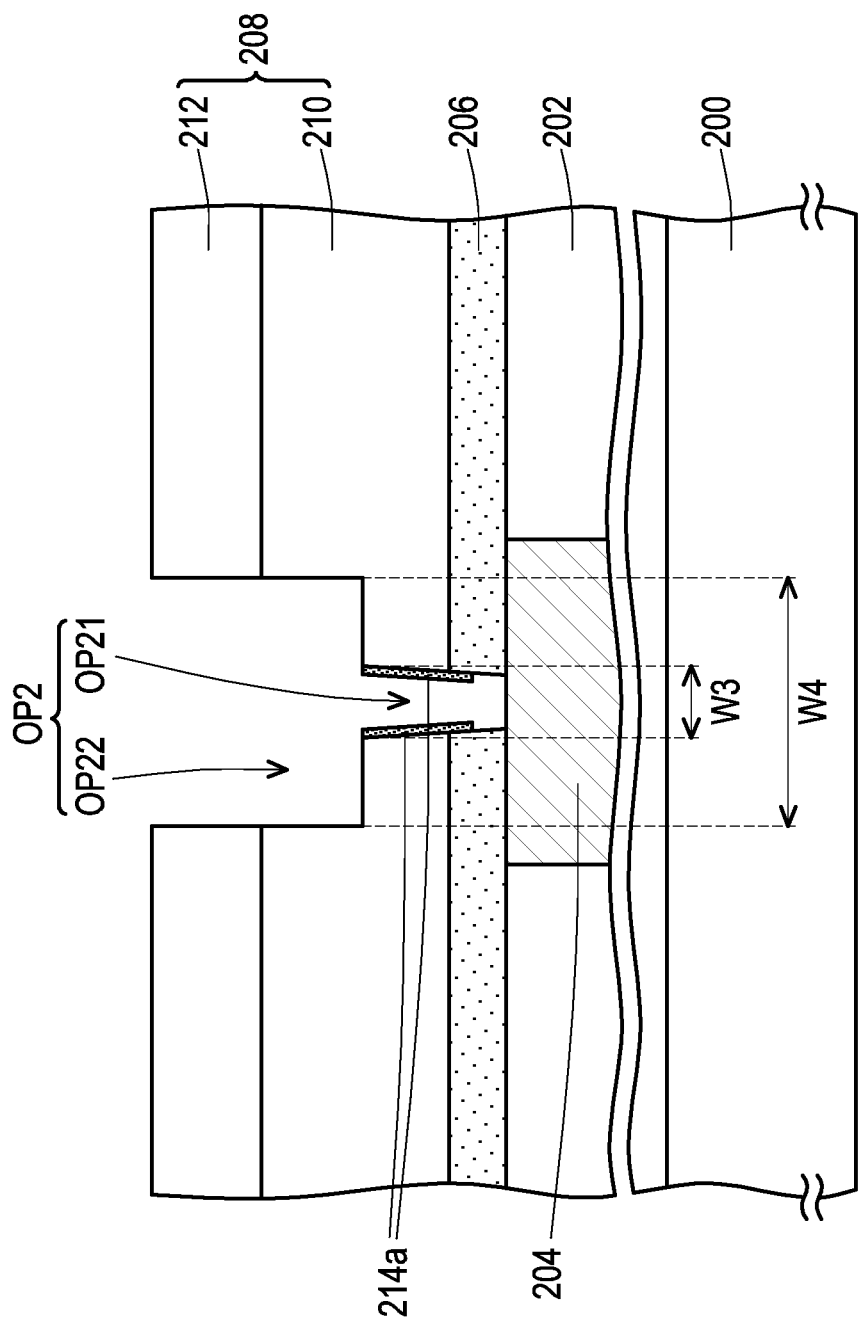

Referring to FIG. 2F, a patterning process is performed by using the patterned photoresist layer 222 as a mask to expand the opening OP2 and to expose the conductive layer 204. The expanded opening OP2 may include an opening portion OP21 and an opening portion OP22. The opening portion OP21 may be located in the capping layer 206 and may expose the conductive layer 204. In some embodiments, the opening portion OP21 may be an opening for accommodating a via. The opening portion OP22 is located above the opening portion OP21. In some embodiments, the opening portion OP22 may be an opening for accommodating a conductive line. The width W4 of the opening portion OP22 may be greater than or equal to the width W3 of the opening portion OP21.

In some embodiments, the patterning process may include removing a portion of the planarization layer 220, a portion of the diffusion barrier layer 214, a portion of the dielectric layer 208, and a portion of the capping layer 206 by using the patterned photoresist layer 222 as a mask. In some embodiments, after the portion of the diffusion barrier layer 214 is removed, the remaining diffusion barrier layer 214 may form a diffusion barrier spacer 214a on the sidewall of the opening portion OP21. In some embodiments, the method of removing the portion of the planarization layer 220, the portion of the diffusion barrier layer 214, the portion of the dielectric layer 208, and the portion of the capping layer 206 is, for example, a dry etching method. In some embodiments, in the dry etching process for removing the portion of the planarization layer 220, the portion of the diffusion barrier layer 214, the portion of the dielectric layer 208, and the portion of the capping layer 206, the planarization layer 220 may have a higher etching rate.

The patterned photoresist layer 222 may be removed after the conductive layer 204 is exposed. In some embodiments, the method of removing the patterned photoresist layer 222 is, for example, a dry stripping method or a wet stripping method. In addition, in the process of removing the patterned photoresist layer 222, the planarization layer 220 located directly below the patterned photoresist layer 222 may be simultaneously removed.

Figure 2G:
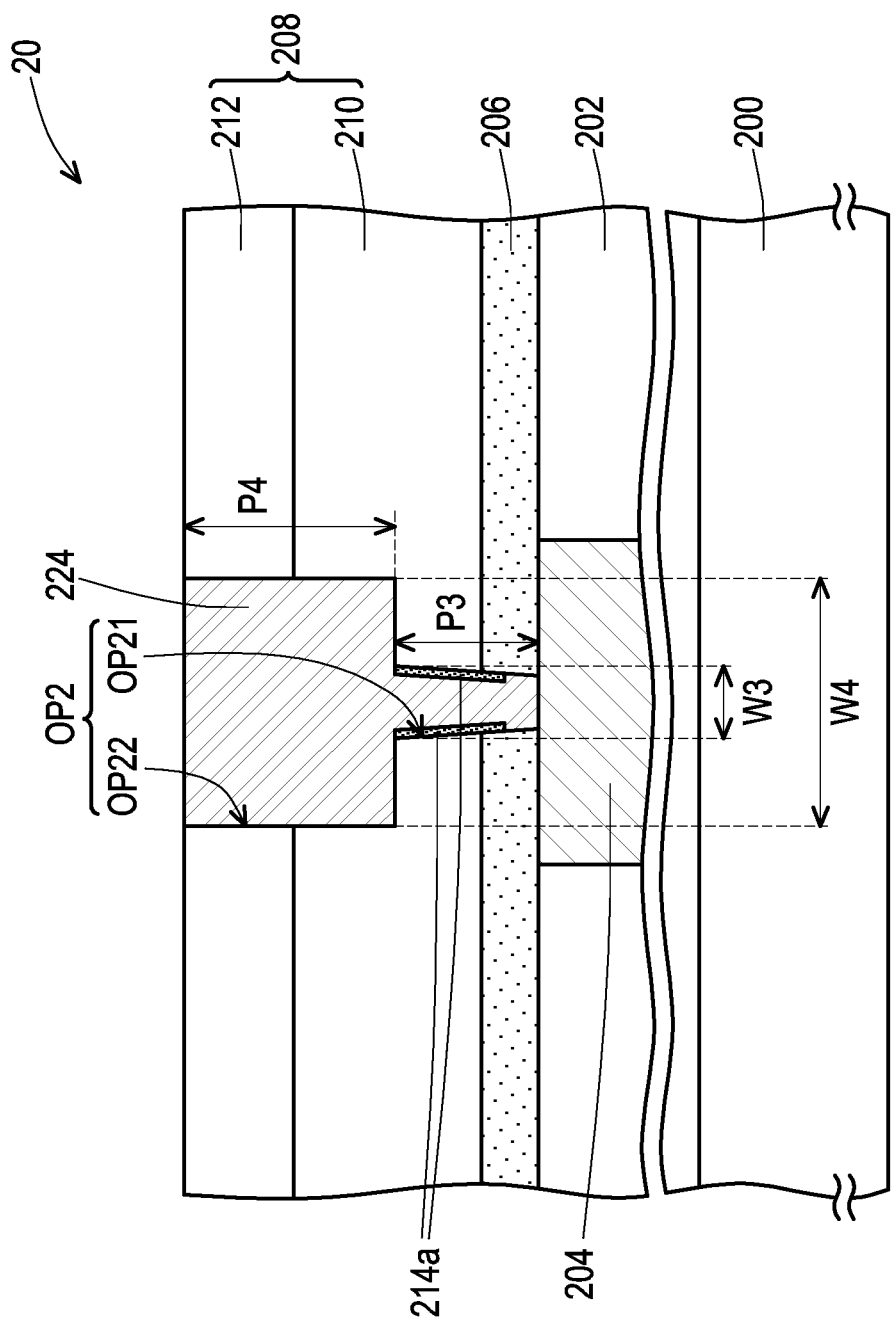

Referring to FIG. 2G, a conductive layer 224 may be formed in the expanded opening OP2. The conductive layer 224 may be electrically connected to the conductive layer 204. In some embodiments, the conductive layer 224 may be a dual damascene structure. In some embodiments, the conductive layer 224 may include a via portion P3 and a conductive line portion P4. The via portion P3 is located in the opening portion OP21. The conductive line portion P4 is located in the opening portion OP22. The conductive line portion P4 may be connected to the via portion P3. In some embodiments, the via portion P3 and the conductive line portion P4 may be integrally formed. In some embodiments, the material of the conductive layer 224 is, for example, metal such as copper. In some embodiments, the conductive layer 224 may be formed by a dual damascene process. In addition, a barrier layer (not shown) may be formed between the conductive layer 224 and the dielectric layer 208, between the conductive layer 224 and the diffusion barrier spacer 214a, between the conductive layer 224 and the capping layer 206, and between the conductive layer 224 and the conductive layer 204, and the description thereof is omitted here.

Based on the above embodiments, in the manufacturing method of the semiconductor structure 20, since the diffusion barrier layer 214 covers the capping layer 206, the diffusion of the nitrogen-containing pollutants produced by the capping layer 206 can be blocked by the diffusion barrier layer 214. Therefore, in the lithography process for forming the patterned photoresist layer 222, photoresist poisoning can be effectively prevented. In this way, the patterned photoresist layer 222 with a desired pattern can be obtained.

In summary, in the manufacturing method of the semiconductor structure of the aforementioned embodiments, since the diffusion barrier layer covers the capping layer, the diffusion of the nitrogen-containing pollutants produced by the capping layer can be blocked by the diffusion barrier layer. Therefore, in the lithography process for forming the patterned photoresist layer, photoresist poisoning can be effectively prevented. In this way, the patterned photoresist layer with a desired pattern can be obtained.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A manufacturing method of a semiconductor structure, comprising:
    providing a substrate;
    forming a first dielectric layer on the substrate;
    forming a first conductive layer in the first dielectric layer;
    forming a capping layer on the first dielectric layer and the first conductive layer, wherein a material of the capping layer is nitride;
    forming a diffusion barrier layer covering the capping layer, wherein a material of the diffusion barrier layer is silicon-rich oxide;
    forming a second dielectric layer on the diffusion barrier layer;
    forming an opening in the second dielectric layer, wherein the opening exposes the diffusion barrier layer;
    forming a patterned photoresist layer on the second dielectric layer; and
    performing a patterning process by using the patterned photoresist layer as a mask to expand the opening and to expose the first conductive layer.

2. The manufacturing method of the semiconductor structure according to claim 1, wherein the patterning process comprises:
    removing a portion of the second dielectric layer, a portion of the diffusion barrier layer, and a portion of the capping layer by using the patterned photoresist layer as a mask.

3. The manufacturing method of the semiconductor structure according to claim 1, wherein the expanded opening comprises:
  a first opening portion located in the diffusion barrier layer and in the capping layer and exposing the first conductive layer; and
  a second opening portion located above the first opening portion, wherein a width of the second opening portion is greater than or equal to a width of the first opening portion.

4. The manufacturing method of the semiconductor structure according to claim 1, further comprising:
  forming a planarization layer on a top surface of the second dielectric layer and in the opening, wherein the patterned photoresist layer is formed on the planarization layer.

5. The manufacturing method of the semiconductor structure according to claim 4, wherein a method of forming the planarization layer comprises a spin coating method.

6. The manufacturing method of the semiconductor structure according to claim 4, wherein the planarization layer comprises a filling layer and a planarization material layer, and a method of forming the planarization layer comprises:
  forming a filling material layer on the top surface of the second dielectric layer and in the opening;
  performing an etch-back process on the filling material layer to form the filling layer; and
  forming the planarization material layer on the top surface of the second dielectric layer and in the opening, wherein the planarization material layer is connected to the filling layer.

7. The manufacturing method of the semiconductor structure according to claim 4, further comprising:
  removing a portion of the planarization layer by using the patterned photoresist layer as a mask.

8. The manufacturing method of the semiconductor structure according to claim 1, further comprising:
  removing the patterned photoresist layer after exposing the first conductive layer.

9. The manufacturing method of the semiconductor structure according to claim 1, further comprising:
  forming a second conductive layer in the expanded opening, wherein the second conductive layer is electrically connected to the first conductive layer.

10. The manufacturing method of the semiconductor structure according to claim 9, wherein the second conductive layer comprises a dual damascene structure.

* * * * *